United States Patent
Huang et al.

(10) Patent No.: US 7,471,122 B2
(45) Date of Patent: Dec. 30, 2008

(54) SHIFT REGISTER

(75) Inventors: Chien-Hsiang Huang, Tainan County (TW); Ming-Chun Tseng, Tainan County (TW); Hong-Ru Guo, Tainan County (TW)

(73) Assignees: Chi Mei El Corporation, Tainan County (TW); Chi Mei Optroelectronics Corporation, Tainan County (TW)

( * ) Notice: Subject to any disclaimer, the term of this patent is extended or adjusted under 35 U.S.C. 154(b) by 52 days.

(21) Appl. No.: 11/399,128

(22) Filed: Apr. 5, 2006

(65) Prior Publication Data

US 2007/0014390 A1    Jan. 18, 2007

(30) Foreign Application Priority Data

Jul. 12, 2005    (TW) ............................... 94123512 A

(51) Int. Cl.
*H03B 1/00*    (2006.01)
(52) U.S. Cl. ..................... 327/112; 327/427; 377/64
(58) Field of Classification Search ............. 327/112, 327/427; 377/64, 77–81; 326/93–95
See application file for complete search history.

(56) References Cited

U.S. PATENT DOCUMENTS

| | | | | |
|---|---|---|---|---|
| 5,289,518 A * | 2/1994 | Nakao | ................. | 377/81 |
| 5,949,271 A * | 9/1999 | Fujikura | ................. | 327/390 |
| 6,867,619 B2 * | 3/2005 | Hong et al. | ................. | 326/97 |
| 6,885,723 B2 * | 4/2005 | Yu | ................. | 377/78 |
| 7,027,550 B2 * | 4/2006 | Lin | ................. | 377/64 |
| 7,079,617 B2 * | 7/2006 | Osame et al. | ................. | 377/81 |
| 7,120,221 B2 * | 10/2006 | Moon | ................. | 377/64 |
| 7,233,308 B2 * | 6/2007 | Park | ................. | 345/100 |

* cited by examiner

*Primary Examiner*—Lincoln Donovan
*Assistant Examiner*—Hai L. Nguyen
(74) *Attorney, Agent, or Firm*—J.C. Patents

(57) ABSTRACT

A shift register includes a control unit, a signal switching unit and a buffer unit. The control unit determines whether to transfer an input signal from a first input terminal to a first output terminal according to a first control signal, and determines whether to conduct a first pre-defined voltage to a second output terminal according to a second control signal. The signal switching unit uses the signal output from the first output terminal as one of the considerations for determining whether to conduct a second pre-defined voltage to a third output terminal, and uses the second control signal as one of the considerations for determining whether to conduct the second pre-defined voltage to the first output terminal. The buffer unit outputs signal according to the signals from the first/third output terminals. Further, at least once, the second control signal is enabled after the first control signal has been enabled.

1 Claim, 13 Drawing Sheets

SHIFT REGISTER

CROSS-REFERENCE TO RELATED APPLICATION

This application claims the priority benefit of Taiwan application Ser. No. 94123512, filed on Jul. 12, 2005. All disclosure of the Taiwan application is incorporated herein by reference.

BACKGROUND OF THE INVENTION

1. Field of Invention

The present invention relates to a digital logical circuit. More particularly, the present invention relates to a shift register.

2. Description of Related Art

The shift register is a widely used digital logical circuit. For example, the shift register plays a key role in the driving architecture of the flat panel display.

Referring to FIG. 1, FIG. 1 is a circuit diagram of a conventional CMOS shift register circuit, applied in low temperature poly silicon (LTPS) technology and implemented upon a glass substrate. The shift register circuit mainly comprises multiple-stage latching circuits 101 and logical circuits 103 in serial connection. Wherein, each latching circuit 101 in a stage is consisted of six transistors, and each logical circuit 103 in a stage needs four transistors.

However, as all of the electronic devices tend to be small size in the information-exploding modern life, the flat panel display is required to achieve high resolution to satisfy customer's requirement in addition to the mini size. Therefore, although the shift register in FIG. 1 can achieve the necessary native function, each shift register of the circuit needs ten registers. The large-scale circuit design is certainly not suitable for the requirement of the evolvement of the modern technologies.

SUMMARY OF THE INVENTION

Accordingly, the present invention is directed to provide a shift register, which can provide the functions of the conventional shift register with less transistors.

Another aspect of the present invention is to provide a shift register, which only applies the circuit design of PMOS or NMOS, so that the fabricating process can be simplified.

The present invention provides a shift register, comprising a control unit, a signal switching unit and a buffer unit. The control unit comprises a first input terminal, a first output terminal and a second output terminal. The control unit determines whether to transfer the input signal received by the first input terminal to the first output terminal to output according to the first control signal, and determines whether to conduct the first pre-defined voltage to the second output terminal according to the second control signal. The signal switching unit has a third output terminal coupled to the second output terminal, wherein the signal output from the first output terminal is used as one of the considerations for determining whether to conduct the third output terminal to a second pre-defined voltage. The buffer unit outputs signal according to the signals from the first output terminal and the third output terminal. Wherein, at least once, the second control signal is enabled after the first control signal is enabled.

According to one embodiment of the present invention, the signal switching unit comprises a first transistor and a second transistor. Wherein, the first transistor comprises a first control terminal, a first signal input/output (I/O) terminal and a second signal I/O terminal. The first control terminal receives the second control signal, the first signal I/O terminal receives a second pre-defined voltage, and the second signal I/O terminal is coupled to the first output terminal. The second transistor comprises a second control terminal, a third signal I/O terminal and a fourth signal I/O terminal. The second control terminal is coupled to the first output terminal, the third signal I/O terminal receives the second pre-defined voltage, and the fourth signal I/O terminalis coupled to the third output terminal.

According to one embodiment of the present invention, the signal switching unit comprises a first transistor and a second transistor. The first transistor comprises a first control terminal, a first signal I/O terminal and a second signal I/O terminal. The first control terminal is coupled to a third output terminal, the first signal I/O terminal receives the second pre-defined voltage, and the second signal I/O terminal is coupled to the first output terminal. The second transistor comprises a second control terminal, a third signal I/O terminal and a fourth signal I/O terminal. The second control terminal is coupled to the first output terminal, the third signal I/O terminal receives the second pre-defined voltage, and the fourth signal I/O terminal is coupled to the third output terminal.

According to one embodiment of the present invention, the signal switching unit comprises a transistor, wherein the transistor comprises a control terminal and two signal I/O terminals. The control terminal of the transistor is coupled to the first output terminal, wherein one of the signal I/O terminals receives the second pre-defined voltage, and the other signal I/O terminal is the aforementioned third output terminal.

According to one embodiment of the present invention, the signal switching unit comprises a first transistor, a second transistor, a third transistor, and a fourth transistor. The first transistor comprises a first control terminal, a first signal I/O terminal and a second signal I/O terminal; the first control terminal is coupled to the third output terminal; and the first signal I/O terminal receives the second pre-defined voltage. The second transistor comprises a second control terminal, a third signal I/O terminal and a fourth signal I/O terminal. Wherein, the second control terminal is coupled to the first output terminal and the third signal I/O terminal receives the second pre-defined voltage. The third transistor comprises a third control terminal, a fifth signal I/O terminal and a sixth signal I/O terminal. Wherein, the third control terminal receives the second control signal, the fifth signal I/O terminal is coupled to the second signal I/O terminal, and the sixth signal I/O terminal is coupled to the first output terminal. The fourth transistor comprises a fourth control terminal, a seventh signal I/O terminal and an eighth signal I/O terminal; the fourth control terminal receives the input signal; the seventh signal I/O terminal is coupled to the fourth I/O terminal; and the eighth signal I/O terminal is coupled to the third output terminal.

According to one embodiment of the present invention, the signal switching unit comprises a first transistor and a second transistor. The first transistor comprises a first control terminal, a first signal I/O terminal and a second signal I/O terminal; the first control terminal is coupled to the first output terminal; and the first signal I/O terminal receives the second pre-defined voltage. The second transistor comprises a second control terminal, a third signal I/O terminal and a fourth signal I/O terminal; the second control terminal receives the input signal; the third signal I/O terminal is coupled to the second signal I/O terminal; and the fourth signal I/O terminal is the aforementioned third output terminal.

According to one embodiment of the present invention, when a plurality of shift registers is connected serially to form a shift register set, the first input terminal of the Nth order shift register is coupled to the output terminal of the buffer unit of the N-1th order shift register, and the second control signal of the N-1th order shift register is coupled to the output terminal of the buffer unit of the Nth order shift register. In addition, the first control signals respectively used in the two successive order shift registers are not overlapped, that is, the first control signals of the two successive shift registers are not at the same electrical potential simultaneously.

According to one embodiment of the present invention, when a plurality of shift registers is connected serially to form a shift register set, the first input terminal of the Nth order shift register is coupled to the output terminal of the buffer unit of the N-1th order shift register, and the second control signal must be enabled after the first control signal is enabled and before the first control signal is being enabled again.

The present invention further provides another shift register, comprising a control unit, a signal switching unit and a buffer unit. The control unit comprises a first input terminal, a first output terminal and a second output terminal. The control unit determines whether to transfer an input signal received by the first input terminal to the first output terminal to output according to a first control signal, and determines whether to conduct a first pre-defined voltage to the second output terminal according to a second control signal. The signal switching unit comprises a third output terminal coupled to the second output terminal, wherein the input signal is used as one of the considerations for determining whether to conduct a second pre-defined voltage to the third output terminal. The buffer unit determines the output signal of the output terminal of the buffer unit according to the signals of the first output terminal and the third output terminal.

According to one embodiment of the present invention, the signal switching unit comprises a transistor. The transistor has a control terminal and two signal I/O terminals. The control terminal receives the input signal, wherein one of the signal I/O terminals receives the second pre-defined voltage, and the other signal I/O terminal is the aforementioned third output terminal.

As mentioned above, as the buffer unit and the control unit can be respectively formed by two transistors, adding the transistors in the signal switching unit, the shift register of the present invention needs only 5-8 transistors. Compared to the circuit comprising ten transistors to achieve the similar function, the shift register of the present invention can relatively save the layout space.

In order to make the aforementioned and other objects, features and advantages of the present invention comprehensible, preferred embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
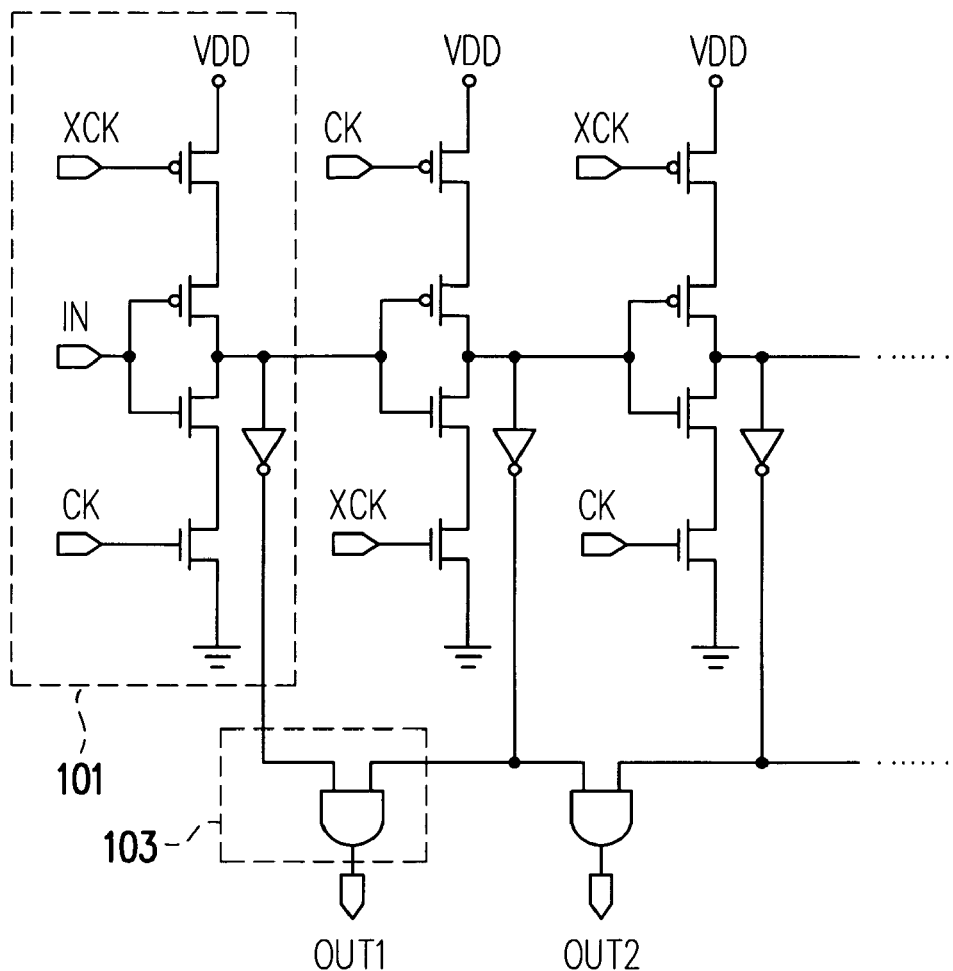
FIG. 1 is a circuit diagram of the conventional CMOS shift register applied in low temperature poly silicon (LTPS) technology.
Figure 2:
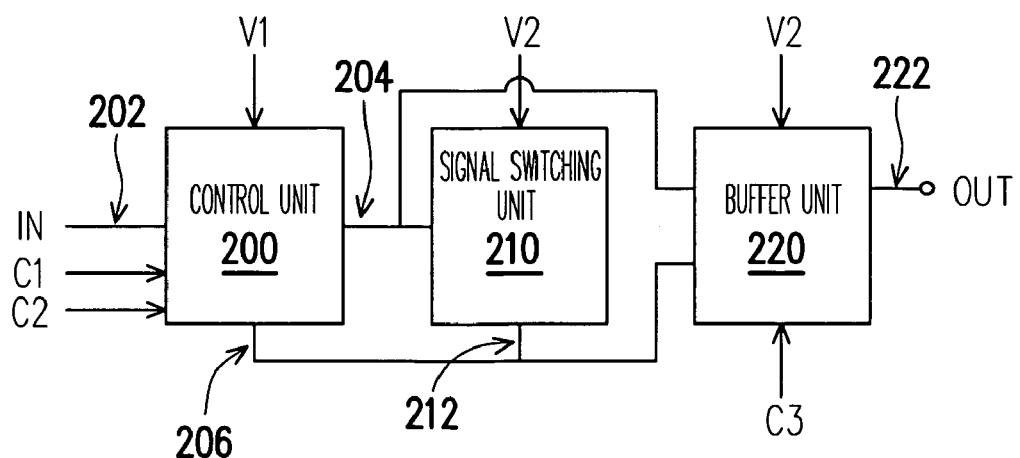
FIG. 2 is a schematic block circuit diagram of the shift register according to one embodiment of the present invention.

Referring to FIG. 2, FIG. 2 is a schematic block circuit diagram of the shift register according to one embodiment of the present invention. In the embodiment of the present invention, the shift register 20 comprises a control unit 200, a signal switching unit 210 and a buffer unit 220. Wherein, the control unit 200 has an input terminal 202 and output terminals 204, 206, and additionally receives the control signals C1 and C2. The input terminal 202 is used for receiving the input signal IN, and determines whether to transfer the input signal IN to the output terminal 204 to output according to the control signal C1. Moreover, the control unit 200 also determines whether to conduct a pre-defined voltage V1 to the output terminal 206 according to the control signal C2. In addition, the output terminal 212 of the signal switching unit 210 is coupled to the output terminal 206 of the control unit 200, and the signal switching unit 210 uses the signal output from the output terminal 204 as one of the considerations for determining whether to conduct another pre-defined voltage V2 to the output terminal 212. In addition, the buffer unit 220 determines the output signal OUT from the output terminal 222 according to the output signals from the output terminal 204 and the output terminal 212, the second voltage and the third control signal.

In order for the common technicians in the field to easily understand the technology of the present invention, the following will further demonstrate several feasible actual implemented circuits. However, the implemented circuits are just used for examples, and the present invention is not limited by those.

Figure 3:
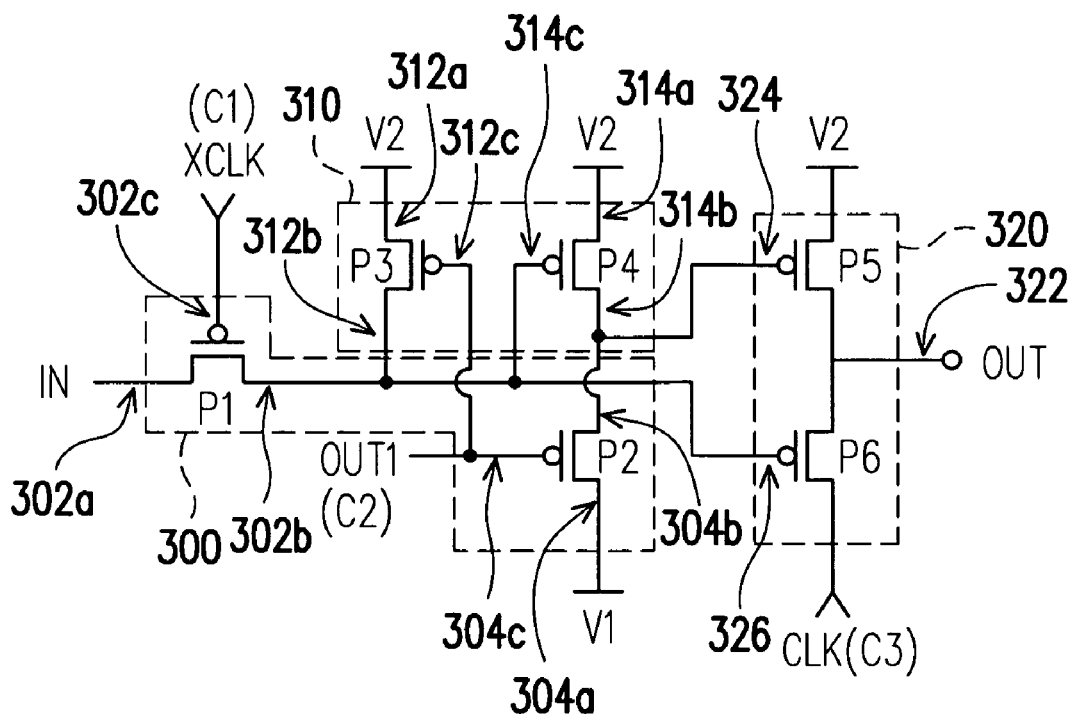
FIG. 3 is a circuit diagram of the shift register according to one embodiment of the present invention.

Referring to FIG. 3, FIG. 3 is a circuit diagram of the shift register according to one embodiment of the present invention. In the embodiment, the control unit 300 comprises P type metal oxide semiconductors (PMOS) P1, P2. Wherein, one of the I/O terminals (source) 302a of the PMOS P1 is used as the input terminal 202 in FIG. 2 to receive the input signal IN, the other signal I/O terminal (drain) 302b is used as the signal output terminal 204 in FIG. 2, and the control terminal (gate) 302c receives the control signal XCLK (equivalent to the control signal C1 in FIG. 2). Accordingly, the control signal XCLK can be used to control whether to transfer the input signal IN to the other signal I/O terminal 302b from the signal I/O terminal 302a. Moreover, one signal I/O terminal 304a of the PMOS P2 is conducted to the predefined voltage V1, the other signal I/O terminal 304b is used as the output terminal 206 in FIG. 2, and the control terminal 304c receives the control signal OUT1 (equivalent to the control signal C2 in FIG. 2). Accordingly, the control signal OUT1 can be used to control whether to conduct the pre-defined voltage V1 to the signal I/O terminal 304b from the signal I/O terminal 304a.

It needs to be noticed that the control signal OUT1 here indicates the output signal of another shift register (not shown) which is connected to the output terminal 322. In the shift register set comprising multiple cascaded shift registers, a redundant shift register is usually applied to provide its output as the control signal for the previous shift register, and the redundant shift register substitutes the control signal C2 by the output OUT of the first shift register.

Continuing to refer to FIG. 3, the signal switching unit 310 of the embodiment comprises PMOS P3 and P4. Wherein, the PMOS P3 comprises a control terminal 312c and signal I/O terminals 312a and 312b. The control terminal 312c receives the control signal OUT1, the signal I/O terminal 312a receives the predefined voltage V2, and the other signal I/O terminal is coupled to the signal I/O terminal 302b of the PMOS P1. The PMOS P4 comprises a control terminal 314c and signal I/O terminals 314a, 314b, wherein the control terminal 314c is coupled to the signal I/O terminal 302b of the PMOS P1, the signal I/O terminal 314a receives the pre-defined voltage V2, and the other signal I/O terminal 314b is coupled to the signal I/O terminal 304b of the PMOS P2.

In addition, the embodiment further comprises a buffer unit 320, which can be achieved by a circuit composed of two PMOS P5 and P6. Wherein, the control terminal 324 of the PMOS P5 is coupled to the signal I/O terminal 304b of the PMOS P2, one of the signal I/O terminals is coupled to the pre-defined voltage V2, and the other signal I/O terminal is coupled to the output terminal 322. The control terminal 326 of the PMOS P6 is coupled to the signal I/O terminal 302b of the PMOS P1, one of the signal I/O terminals is coupled to the clock signal CLK (or C3), and the other signal I/O terminal is coupled to the output terminal 322.

It needs to be noticed that as the transistor used here is a P type transistor, the pre-defined voltage V1 should be a low working voltage source, usually called VSS, and the pre-defined V2 is a high working voltage source, usually called VDD.

In addition to the embodiment shown in FIG. 3, a shift register can be formed by the same control unit 300 and buffer unit 320 cooperating with a signal switching unit 310 different from that in FIG. 3.

Figure 4:
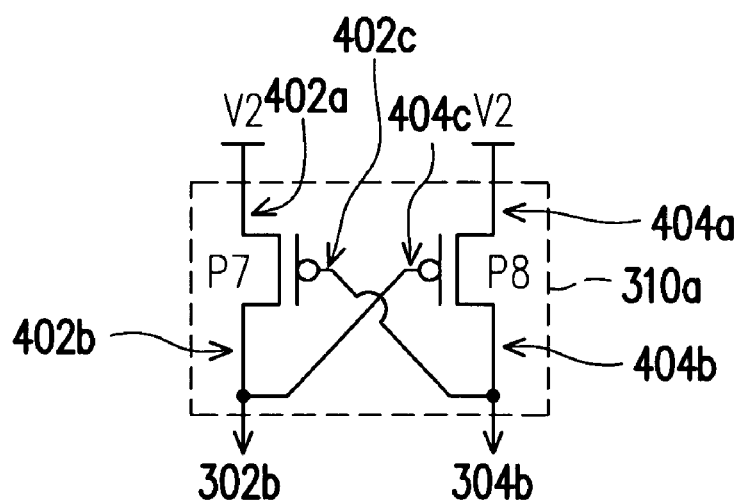
FIG. 4 is a circuit diagram of the signal switching unit according to another embodiment of the present invention.

Referring to FIG. 4, FIG. 4 is a circuit diagram of the signal switching unit according to another embodiment of the present invention. The signal switching unit 310a of the embodiment comprises two PMOS P7 and P8. One signal I/O terminal 402a of the PMOS P7 receives the pre-defined voltage V2, the other signal I/O terminal 402b is coupled to the signal I/O terminal 302b of the PMOS P1, and the control terminal 402c of the PMOS P7 is coupled to the signal I/O terminal 304b of the PMOS P2. The signal I/O terminal 404a of the PMOS P8 receives the pre-defined voltage V2, the other signal I/O terminal 404b is coupled to the signal I/O terminal 304b of the PMOS P2, and the control terminal 404c is coupled to the signal I/O terminal 302b of the PMOS P1.

Figure 5:
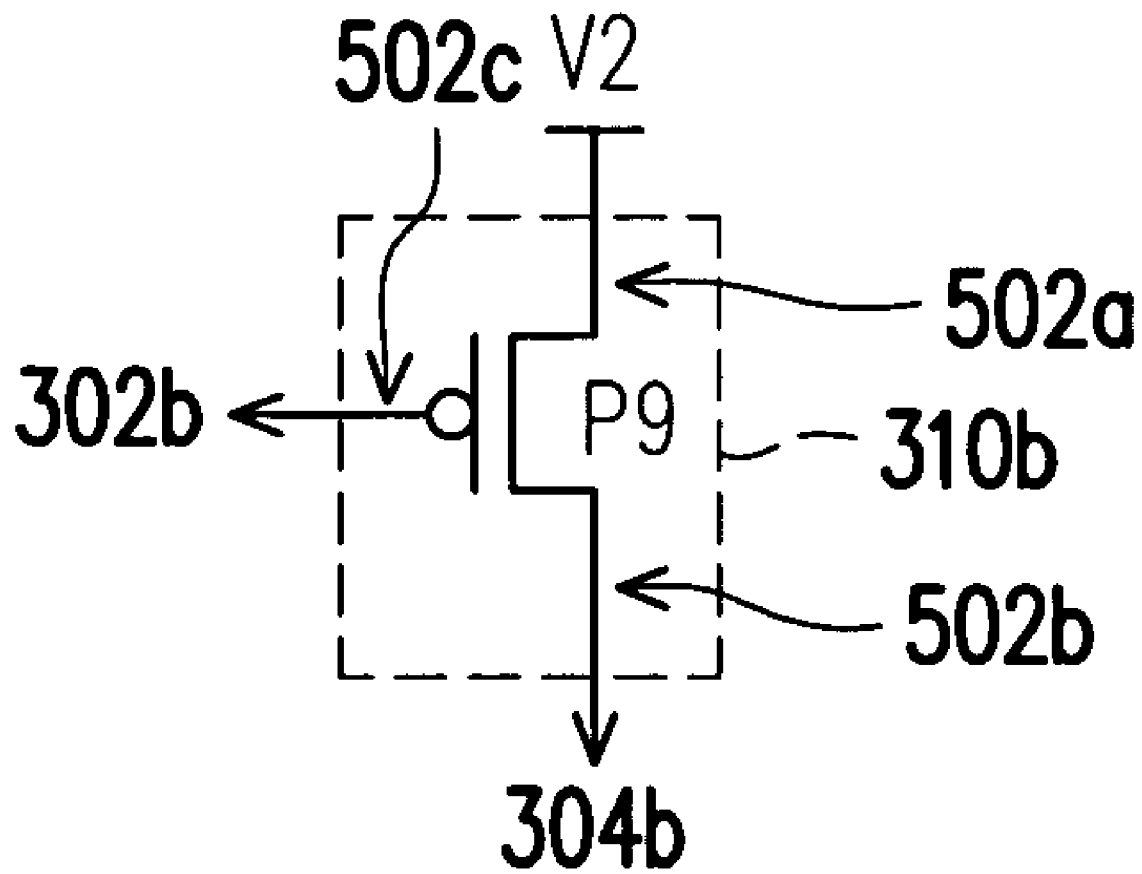
FIG. 5 is a circuit diagram of the signal switching unit according to another embodiment of the present invention.

Referring to FIG. 5, FIG. 5 is a circuit diagram of the signal switching unit according to another embodiment of the present invention. Wherein, the signal switching unit 310b comprises a PMOS P9. The signal I/O terminal 502a of the PMOS P9 receives the pre-defined voltage V2, the other signal I/O terminal 502b is coupled to the signal I/O terminal 304b of the PMOS P2, and the control terminal 502c of the PMOS P9 is coupled to the signal I/O terminal 302b of the PMOS P1.

Figure 6:
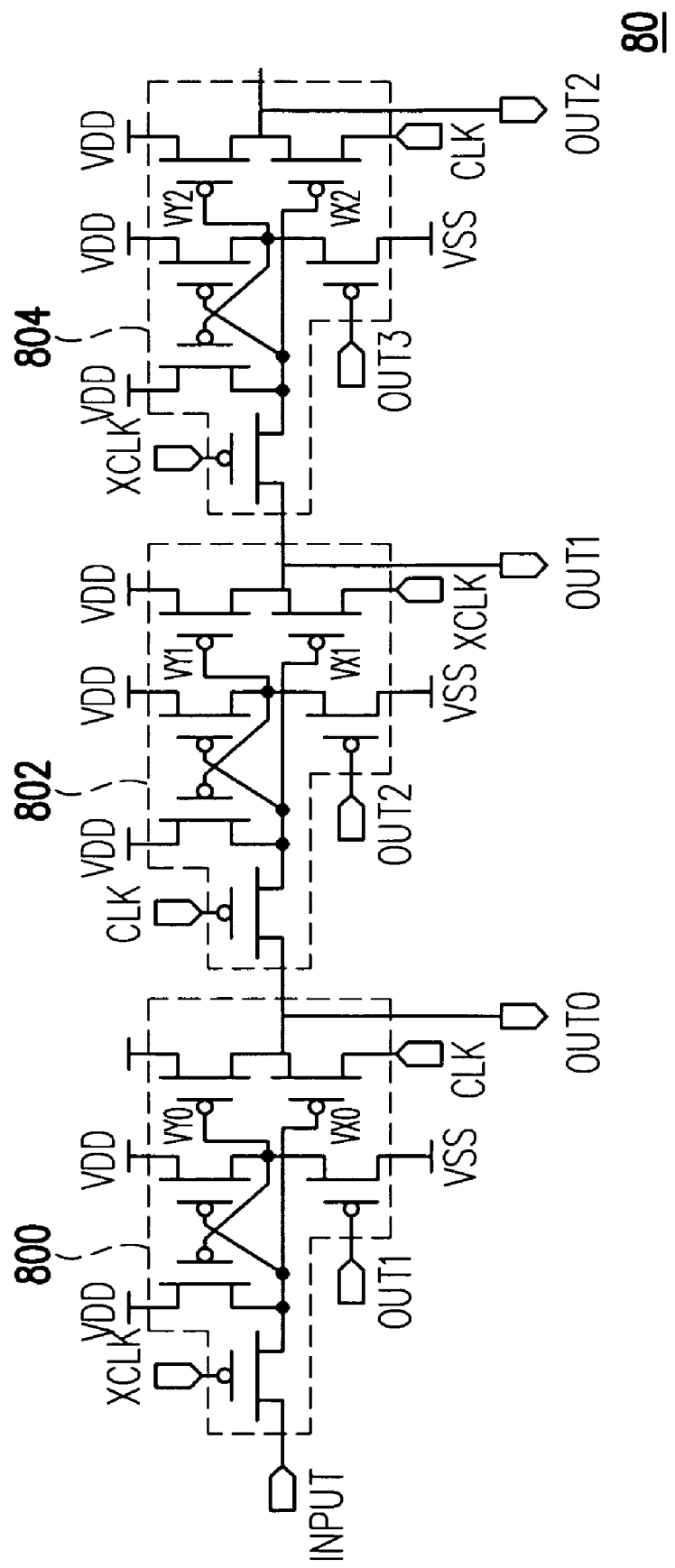
FIG. 6 is a circuit diagram of the shift register set comprising the shift registers according to one embodiment of the present invention.

Referring to FIG. 6, FIG. 6 is a circuit diagram of the shift register set comprising the shift registers according to one embodiment of the present invention. In the embodiment, the shift register set 80 comprises a plurality of cascaded shift registers 800, 802 and 804, and each shift register respectively comprises the control unit 300 and the buffer unit 320 as shown in FIG. 3, and the signal switching unit 310a as shown in FIG. 4.

Figure 7:
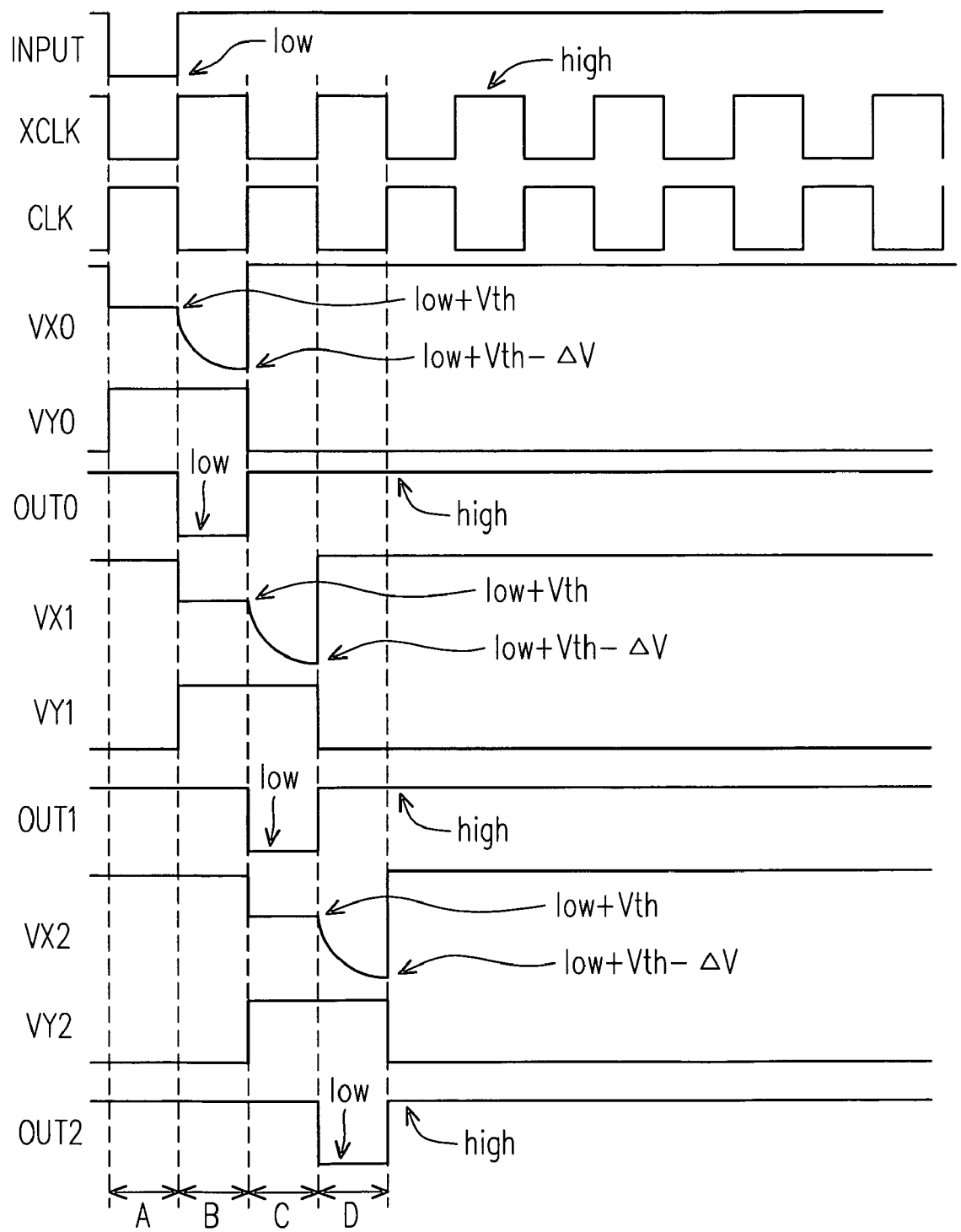
FIG. 7 is a clock diagram of/the change of the electric potential at the node indicated in FIG. 6.

49 Referring to FIG. 7 simultaneously, FIG. 7 is a clock diagram of the change of the electric potential at the node indicated in FIG. 6. In the embodiment, the signals XCLK and CLK are reversed to each other, and the two successive order shift registers (for example, the shift registers 800 and 802) apply the reversed signals XCLK and CLK as the aforementioned control signal C1. In addition, the input terminal of the posterior order shift register (for example, the shift register 802) is coupled to the output terminal OUT0 of the buffer unit of the previous order shift register (for example, the shift register 800), and the previous order shift register (for example, the shift register 800) applies the output OUT1 of the posterior order shift register (for example, the shift register 802) as another control signal. It is easy for the common technician to deduce the operation relation from the clock diagram in FIG. 7, so that the detailed description is omitted, and only the meanings of the symbols in the figure and the specific points of the operation are described here. The voltage levels high and low in the figure respectively represent the electric potentials provided by the VDD and VSS, and Vth is the threshold voltage of the PMOS P6 in the buffer unit as shown in FIG. 3. Because of the (parasitic) capacitance coupling effect, the voltage level of the node VX0 may be increased to low+Vth in period A, but not purely the voltage level low; thereafter, the voltage level of the node VX0 may be further reduced to low+Vth−ΔV in period B due to the decrease of the voltage level of the CLK signal. Wherein, the quantity of the ΔV can be obtained from the following equation:

$$\Delta V = \frac{C\_boost}{C\_boost + C\_eq}(HI - LO)$$

In the shift register 800, the capacitance C_eq is the equivalent capacitance between the voltage VDD and the node VX0, and the capacitance C_boost is the equivalent capacitance between the signal CLK and the node VX0. HI and LO are the high level voltage and low level voltage of the signal CLK, respectively.

Similarly, in periods B and C, the node VX1 may have the same electric potential changing condition due to the capacitance coupling effect.

Figure 8:
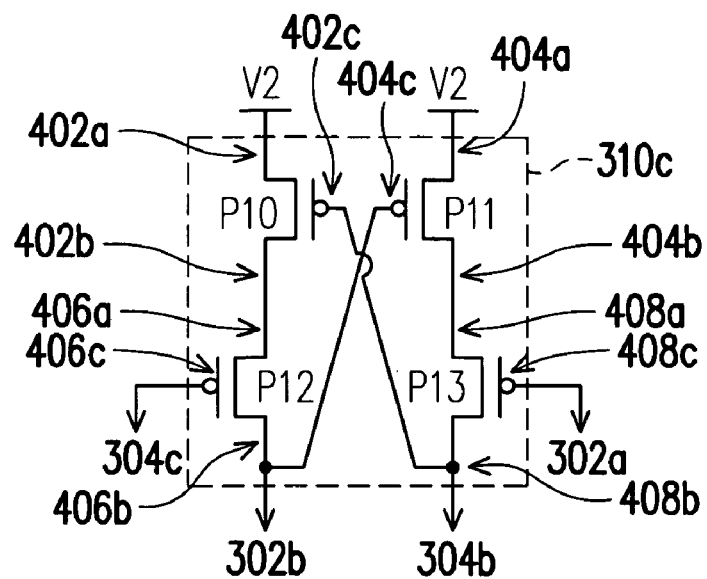
FIG. 8 is a circuit diagram of the signal switching unit according to another embodiment of the present invention.

Referring to FIG. 8, FIG. 8 is a circuit diagram of the signal switching unit according to another embodiment of the present invention. The signal switching unit 310c of the embodiment comprises four PMOS P10, P11, P12, and P13. One signal I/O terminal 402a of the PMOS P10 receives the aforementioned pre-defined voltage V2, and the control terminal 402c is coupled to the signal I/O terminal 304b of the PMOS P2. One signal I/O terminal 404a of the PMOS P11 receives the aforementioned pre-defined voltage V2, and the control terminal 404c is coupled to the signal I/O terminal 302b of the PMOS P1. The signal I/O terminal 406a of the PMOS P12 is coupled to the signal I/O terminal 402b of the PMOS P10, the other signal I/O terminal 406b is coupled to the signal I/O terminal 302b of the PMOS P1, and the control terminal 406c is coupled to the control terminal 304c of the PMOS P2. The signal I/O terminal 408a of the PMOS P13 is coupled to the signal I/O terminal 404b of the PMOS P11, the other signal I/O terminal 408b is coupled to the signal I/O terminal 304b of the PMOS P2, and the control terminal 408c is coupled to the signal I/O terminal 302a of the PMOS P1.

Figure 9:
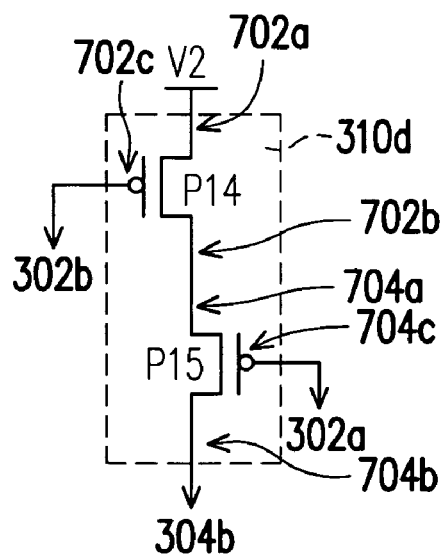
FIG. 9 is a circuit diagram of the signal switching unit according to another embodiment of the present invention.

Referring to FIG. 9, FIG. 9 is a circuit diagram of the signal switching unit according to another embodiment of the present invention. The signal switching unit 310d comprises two PMOS P14 and P15. The signal I/O terminal 702a of the PMOS P14 receives the pre-defined voltage V2, and the control terminal 702c of the PMOS P14 is coupled to the signal I/O terminal 302b of the PMOS P1. One signal I/O terminal 704a of the PMOS P15 is coupled to the signal I/O terminal 702b of the PMOS P14, the other signal I/O terminal 704b is coupled to the signal I/O terminal 304b of the PMOS P2, and the control terminal 704c is coupled to the signal I/O terminal 302a of the PMOS P1.

The above are several examples of the signal switching unit cooperating with the control unit 300 and the buffer unit 320 shown in FIG. 3 to form the shift register, and the operation methods thereof are similar. FIG. 7 describes the operation method thereof using the shift register composed of the signal switching unit 310a in FIG. 4 and the related circuit in FIG. 3, and FIG. 10A and FIG. 10B describe the operation method thereof using the shift register composed of the signal switching unit 310c in FIG. 8 and the related circuit in FIG. 3.

Figure 10A:
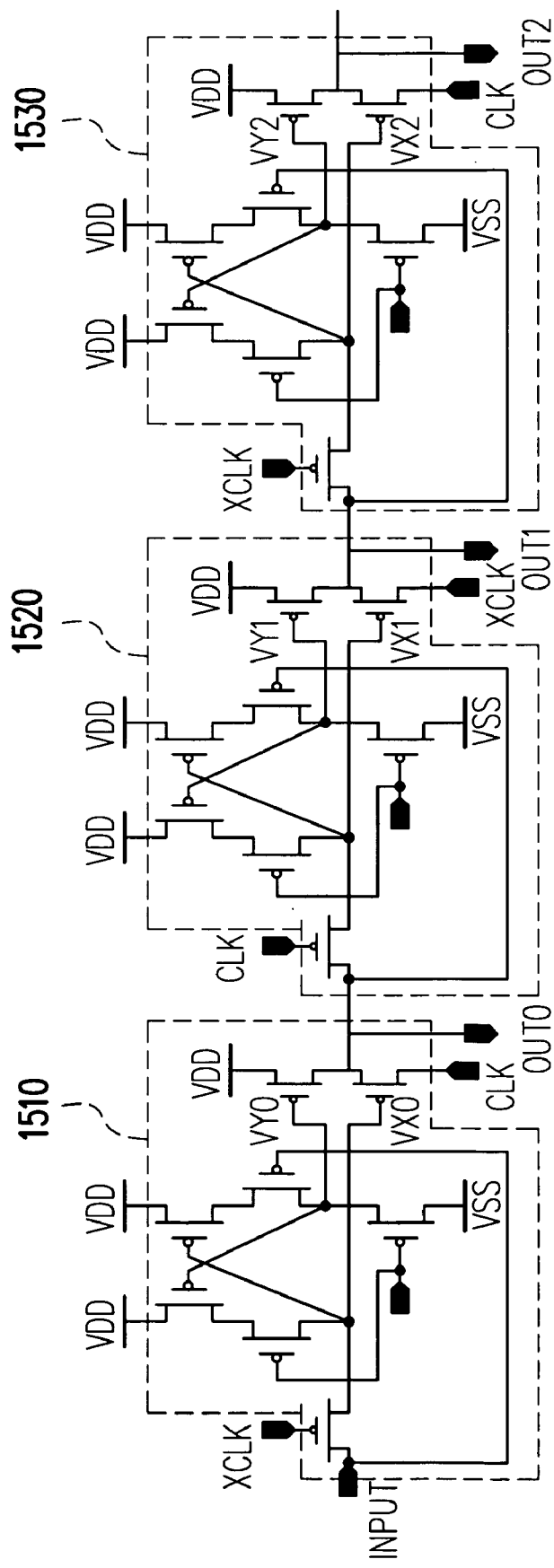
FIG. 10A is a circuit diagram of the shift register set comprising the shift registers according to another embodiment of the present invention.

Referring to FIG. 10A, FIG. 10A is the circuit diagram of a shift register set comprising the signal switching unit 310c in FIG. 8 and the related circuit in FIG. 3. In the embodiment, the shift register set 1500 comprises a plurality of cascaded shift registers 1510, 1520 and 1530, and each shift register respectively comprises the control unit 300 and the buffer unit 320 in FIG. 3 and the signal switching unit 310c in FIG. 8.

Figure 10B:
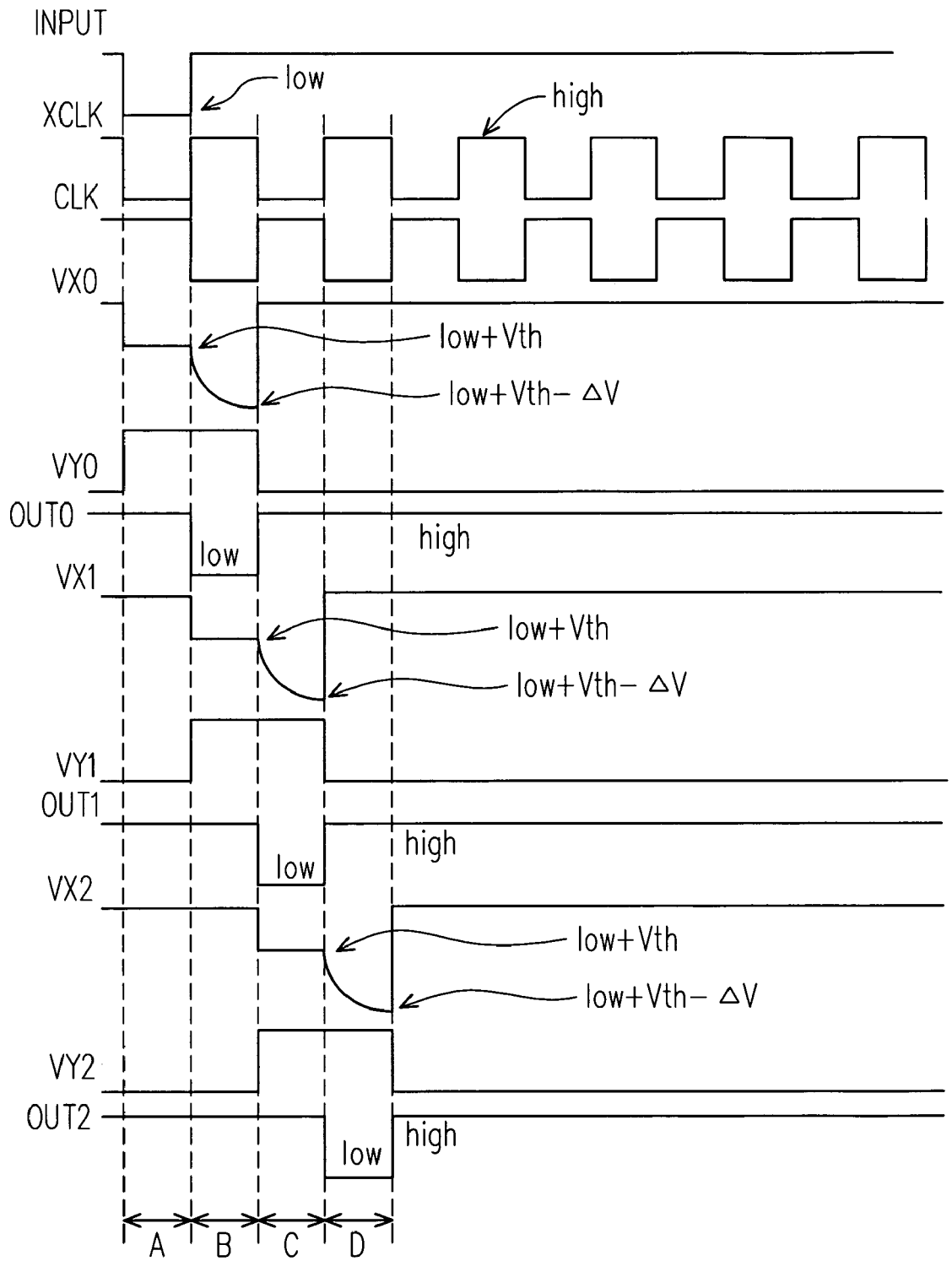
FIG. 10B is a clock diagram of the change of the electric potential at the node indicated in FIG. 10A.

Referring to FIG. 10A and FIG. 10B simultaneously, FIG. 10B is a clock diagram of the change of the electric potential at the node indicated in FIG. 10A. It is easy for the common technician to deduce the operation relation thereof from the clock diagram in FIG. 10B, so that the detailed description is omitted here. Similarly with FIG. 7, the voltage levels high and low in FIG. 10B respectively represent the electric potential provided by the VDD and VSS in FIG. 10A, and Vth is the threshold voltage of the PMOS P6 in the buffer unit as shown in FIG. 3. Because of the (parasitic) capacitance coupling effect, the voltage level at the node VX0 may be increased slightly to low+Vth in period A, but not purely the voltage level low; thereafter, the voltage level at the node VX0 may be further reduced to low+Vth–ΔV in period B due to the decrease of the voltage level of the CLK signal. Similarly, the nodes VX1 and VX2 have the same changing condition of the electric potential due to the capacitance coupling effect. The volume of the ΔV can be obtained from the following equation:

$$\Delta V = \frac{C\_boost}{C\_boost + C\_eq}(HI - LO)$$

In the shift register 1510, the capacitance C_eq is the equivalent capacitance between the voltage VDD and the node VX0, and the capacitance C_boost is the equivalent capacitance between the signal CLK and the node VX0. HI and LO are the high voltage level and low voltage level of the signal CLK, respectively.

Figure 10C:
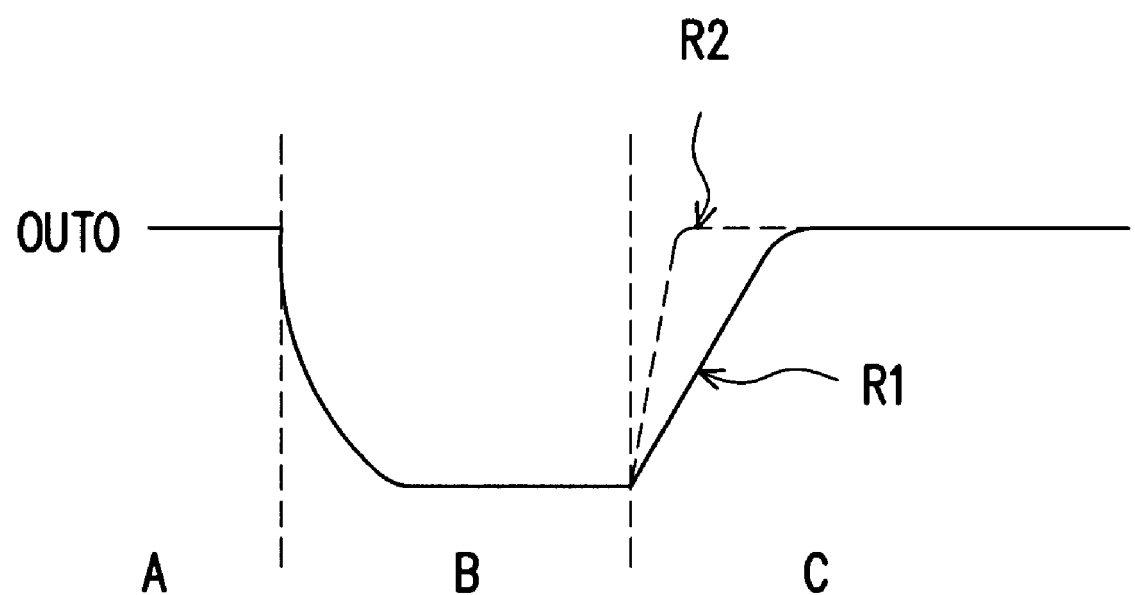
FIG. 10C is a schematic comparison diagram of the change curves of the electric potential at the node OUT0 in FIG. 7 and FIG. 10A.

Compared to the embodiments shown in FIG. 6 and FIG. 7, although there are two more transistors in each shift register in the circuit in FIG. 10A, the time consumption of temporary conversion in each corresponding output nodes (OUT0, OUT1 and OUT2, etc.) in FIG. 10A is shorter than that of the embodiments in FIG. 6 and FIG. 7. Referring to FIG. 10C, wherein, the curve R1 is an enlarged curve of the change curve of the electric potential at the node OUT0 in FIG. 7, and the curve R2 is an enlarged curve of the change curve of the electric potential at the node OUT0 in FIG. 10B. It can be learned from the experiment result that the signal switching units 310c and 310d provided by FIG. 8 and FIG. 9 can reduce the conversion time of the output signal of the shift register, so that the operation speed of the circuit is improved and the power consumption is reduced.

Figure 11:
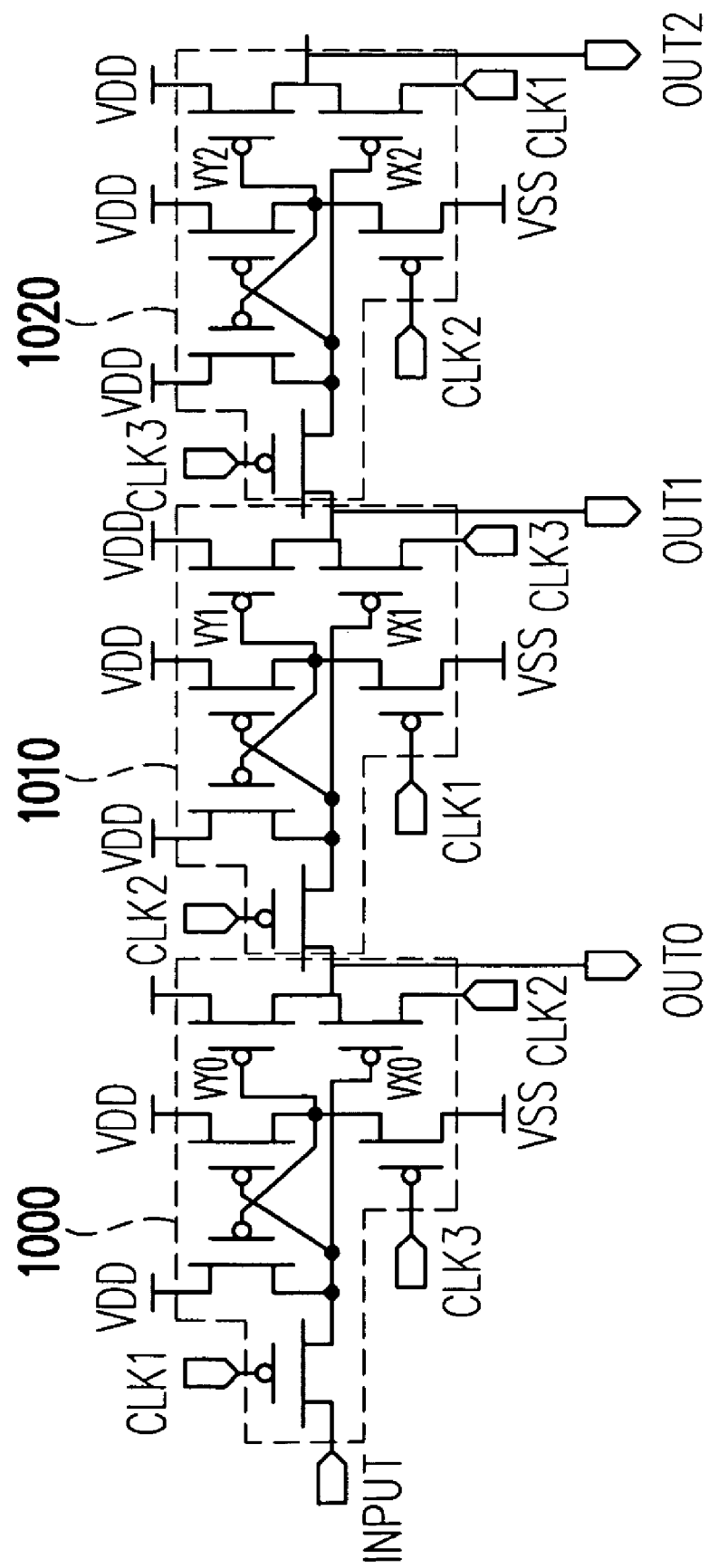
FIG. 11 is a circuit diagram of the shift register set comprising the shift registers according to one embodiment of the present invention.

Moreover, each shift register can also be connected by the method shown in FIG. 11 besides that as shown in FIG. 6. Referring to FIG. 11, FIG. 11 is a circuit diagram of the shift register set comprising the shift registers according to one embodiment of the present invention. Wherein, the connection relation of the shift registers 1000, 1010 and 1012 included in FIG. 11 is similar to that shown in FIG. 6. The difference is that the output signals output from the control signal XCLK (or CLK) and each output nodes (for example, OUT1, etc.) are replaced by three different clock signals (CLK1-CLK3). Wherein, the control signals for controlling the input signal to enter into each shift register in each of the shift registers 1000-1020 must be respectively enabled in sequence, by which the signals can be transferred normally in the shift register set.

Figure 12:
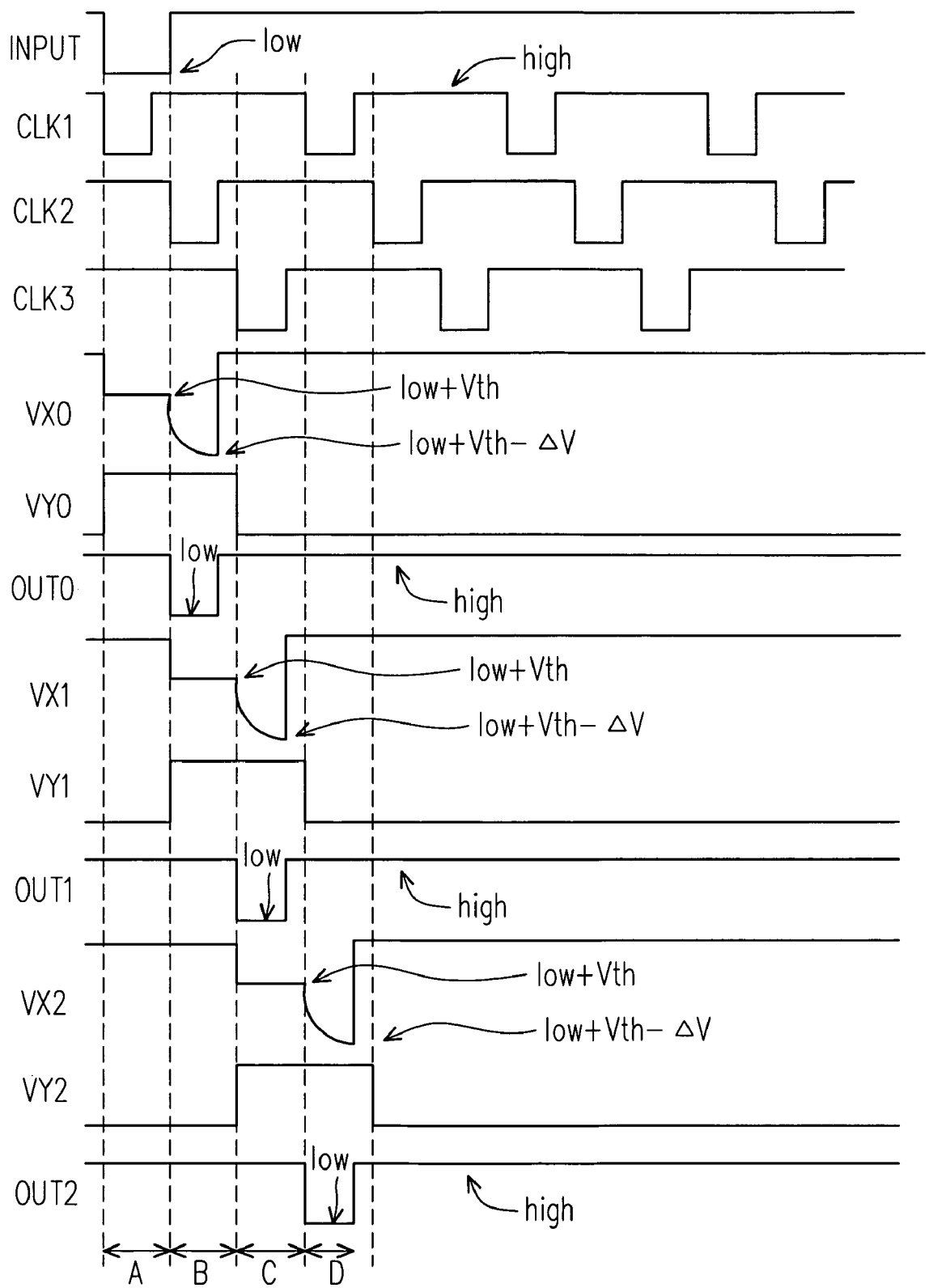
FIG. 12 is a clock diagram of the change of the electric potential at the node indicated in FIG. 11.

The clock diagram of the circuit shown in FIG. 11 is shown in FIG. 12. The operation method thereof is similar to that of the aforementioned embodiments, so that the detail is omitted here.

It needs to be noticed that regardless whether the shift register set shown in FIG. 2, FIG. 6 or FIG. 10A formed by the shift registers in FIGS. 3-5 or FIGS. 8-9, in order to maintain normal operation, at least once, another control signal C2 should be enabled after the control signal C1 shown in FIG. 2 has been enabled. Likewise, no matter whether the shift register shown in FIG. 10A is formed by which shift register in the aforementioned FIG. 3, FIG. 4, FIG. 8, FIG. 9, at least once, another control signal C2 must be enabled once after the control signal C1 shown in FIG. 2 has been enabled. In addition, although all of the transistors of the aforementioned embodiments are illustrated by PMOS, the same effect can also be obtained by replacing the PMOS with NMOS according to common technology. However, when using N type transistors, the aforementioned pre-defined voltage V1 needs to be changed to the commonly called VCC high working voltage, the aforementioned voltage V2 needs to be changed to the commonly called VSS low working voltage, and other control signals also need to be changed accordingly.

Figure 13:
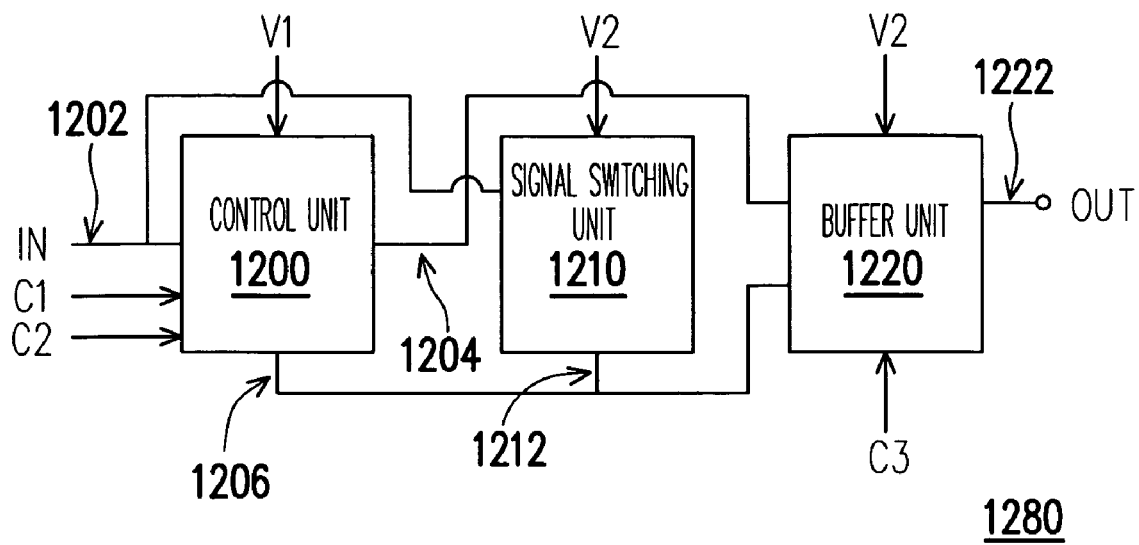
FIG. 13 is a schematic block circuit diagram of the shift register according to one embodiment of the present invention.

Moreover, in another embodiment of the present invention, the connection and operation relation between the control unit and the signal switching unit is slightly changed. Referring to FIG. 13, FIG. 13 is a schematic block circuit diagram of the shift register according to one embodiment of the present invention. Comparing to FIG. 2, the connection relation of the control unit 1200, the signal switching unit 1210, the buffer unit 1220, the input terminal 1202, the output terminals 1204, 1206, 1212 and 1222 is substantially the same as that of the shift register 20. The only difference is that: in the shift register 20, the control signal input into the signal switching unit 210 is provided by the output terminal 204 of the control unit 200; and in the shift register 1280, the control signal input into the signal switching unit 1210 is provided by the input terminal 1202 of the control unit 1200.

Figure 14:
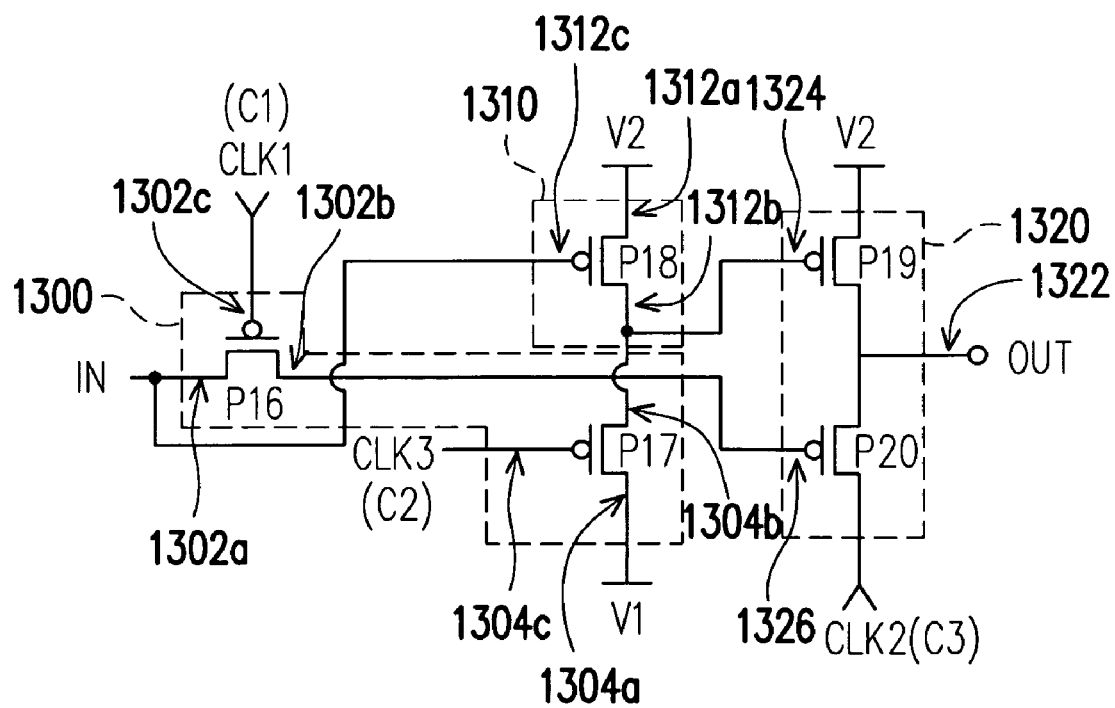
FIG. 14 is a detailed implementation circuit diagram of the shift register in FIG. 13.

FIG. 14 also demonstrates a detailed implementation of the circuit according to the embodiment of the present invention. As shown in FIG. 14, the control unit 1300 comprises two PMOS P16 and P17; the signal switching unit 1310 comprises one PMOS P18; and the buffer unit 1320 comprises two PMOS P19 and P20. Wherein, one signal I/O terminal 1302a of the PMOS P16 receives the input signal IN, the other signal I/O terminal 1302b is used as the signal output terminal 1204 as shown in FIG. 13, and the control terminal 1302c receives the control signal CLK1 (equivalent to the control signal C1 in FIG. 13). Moreover, the signal I/O terminal 1304a of the PMOS P17 receives the pre-defined voltage V1, the other signal I/O terminal 1304b is used as the output terminal 1206 as shown in FIG. 13, and the control terminal 1304c receives the control signal CLK3 (equivalent to the control signal C2 in FIG. 13).

In addition, the control terminal 1312c of the PMOS P18 receives the input signal IN, one signal I/O terminal 1312a receives the pre-defined voltage V2, and the other signal I/O terminal is coupled to the signal I/O terminal 1304b of the PMOS P17. The control terminal 1324 of the PMOS P19 is coupled to the signal I/O terminal 1304b of the PMOS P17, one signal I/O terminal is coupled to the pre-defined voltage V2, and the other signal I/O terminal is coupled to the output terminal 1322. The control terminal 1326 of the PMOS P20 is coupled to the signal I/O terminal 1302b of the PMOS P16, one signal I/O terminal is coupled to the clock signal CLK2 (or C3), and the other signal I/O terminal is coupled to the output terminal 1322.

Figure 15:
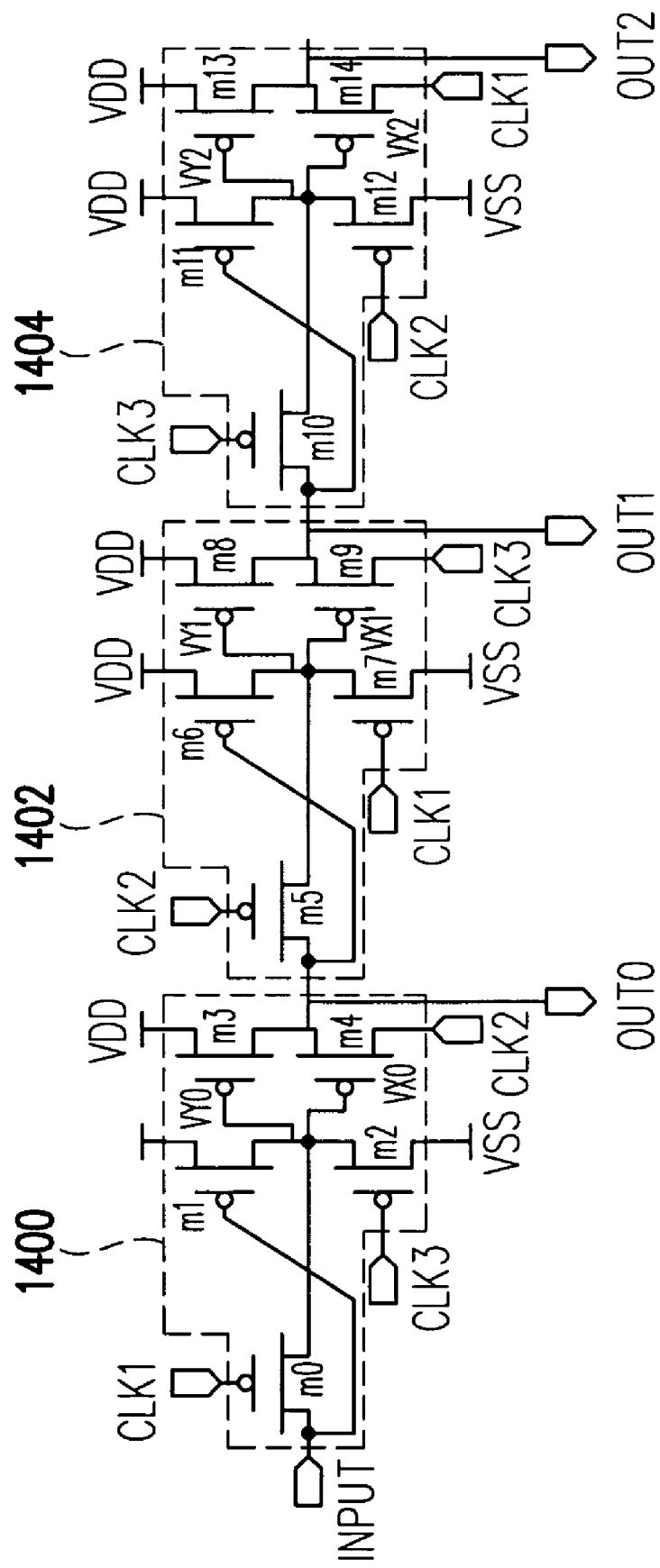
FIG. 15 is a detailed circuit diagram of an embodiment of the shift register set comprising the shift register in FIG. 14.

Similarly, the shift registers provided by FIG. 14 can be cascaded to form the shift register set as shown in FIG. 15. The operation relation thereof is substantially similar to that as shown in FIG. 11 and FIG. 12, so that the further description is omitted here. Moreover, the shift register provided by FIG. 14 can also use the output signal of the next order and the two non-overlapped clock signals as the control signal when being connected in cascade. In other words, referring to FIG. 15, the received signal CLK 1 of the shift register 1400 can be changed to XCLK, the CLK2 is changed to CLK, and the CLK3 is changed to OUT1; the received signal CLK2 of the shift register 1402 is changed to CLK, the signal CLK3 is changed to XCLK, and the signal CLK1 is changed to OUT2; the received signal CLK3 of the shift register 1404 is changed to XCLK, the signal CLK1 is changed to CLK, and the signal CLK2 is changed to OUT3 (the output of the next order shift register of the shift register 1404 is not shown).

In summary, if the shift registers provided by FIG. 14 use the output signal of the next order shift register and the two clock signals in reverse to each other as the control signals when being connected in cascade, the output of the next order shift register of the shift register will be used as the control signal C2 as shown in FIG. 13, and the control signal C1 of the two successive order shift registers is input in alternative of CLK and XCLK, which are reversed to each other.

Likewise, in order to maintain normal operation, at least once, another control signal C2 must be enabled after the control signal C1 has been enabled. In addition, although all of the transistors in FIG. 14 are illustrated as PMOS, the same effect can also be obtained by replacing the PMOS with N type transistors (for example, NMOS) according to common technology. However, as mentioned above, each signal or voltage power needs to be revised accordingly.

In summary, the circuit of each of the shift registers of the present invention can be implemented by five-eight transistors. Compared to the conventional circuit which requires ten transistors to achieve the similar function, the shift register of the present invention can save the arrangement space.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A shift register, comprising:
    a control unit, receiving a first pre-defined voltage, a first control signal, and a second control signal, having a first input terminal, a first output terminal and a second output terminal, wherein the control unit receives an input signal from the first input terminal and determines whether to transfer the input signal to the first output terminal to output according to the first control signal, and determines whether to conduct the first pre-defined voltage to the second output terminal according to the second control signal;
    a signal switching unit, comprising:
        a transistor, comprising a control terminal and two signal I/O terminals, wherein the control terminal of the transistor is directly connected to the first output terminal, one of the signal I/O terminals receives the second pre-defined voltage, and the other signal I/O terminal is coupled to the second output terminal and serves as a third output terminal; and
    a buffer unit, determining the output signal from the output terminal of the buffer unit according to the signals from the first output terminal and the third output terminal, wherein, at least once, the second control signal is enabled after the first control signal is enabled.

* * * * *